US012763737B2

(12) United States Patent
Chen

(10) Patent No.: US 12,763,737 B2
(45) Date of Patent: Oct. 13, 2026

(54) AUDIO AMPLIFIER WITH HIGH PASS FILTER BASED DISTORTION SUPPRESSION

(71) Applicant: Elite Semiconductor Microelectronics Technology Inc., Hsinchu (TW)

(72) Inventor: Isaac Y. Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 294 days.

(21) Appl. No.: 18/518,468

(22) Filed: Nov. 23, 2023

(65) Prior Publication Data

US 2025/0175131 A1 May 29, 2025

(51) Int. Cl.
*H03F 3/187* (2006.01)
*H03F 1/02* (2006.01)
*H03F 1/26* (2006.01)

(52) U.S. Cl.
CPC .......... *H03F 3/187* (2013.01); *H03F 1/0244* (2013.01); *H03F 1/26* (2013.01); *H03F 2200/03* (2013.01)

(58) Field of Classification Search
CPC .......... H03F 3/187; H03F 1/0244; H03F 1/26; H03F 2200/03; H03F 2200/351; H03F 3/217
USPC .................................................... 381/28, 120
See application file for complete search history.

(56) References Cited

U.S. PATENT DOCUMENTS 5,635,871 A * 6/1997 Cavigelli ................ H03F 1/083 330/294
5,880,634 A * 3/1999 Babanezhad .......... H03H 11/04 330/306
9,887,672 B1 * 2/2018 Kuo .................... H03F 3/45475
2009/0028361 A1 1/2009 Risbo
2021/0226591 A1 * 7/2021 Lin ......................... H03F 3/217

FOREIGN PATENT DOCUMENTS

JP 2964149 B * 6/1989 ............ H03H 11/04
TW I697202 B 6/2020

* cited by examiner

*Primary Examiner* — Walter F Briney, III
(74) *Attorney, Agent, or Firm* — Winston Hsu

(57) ABSTRACT

An audio amplifier includes a loop filter, at least one high pass filter (HPF) circuit, a pulse width modulation (PWM) generator, and a power stage. The loop filter is arranged to receive an audio signal and a feedback signal, and includes a first amplifier and a second amplifier, wherein the first amplifier has a first output node, and is arranged to process the audio signal and the feedback signal; the second amplifier has a first input node, and is arranged to receive a first amplifier input and a second amplifier input; and the first amplifier input is obtained from a signal path coupled between the first output node and the first input node. The at least one HPF circuit is coupled between the first amplifier and the second amplifier, and is arranged generate and output the second amplifier input according to an amplifier output of the first amplifier.

12 Claims, 4 Drawing Sheets

AUDIO AMPLIFIER WITH HIGH PASS FILTER BASED DISTORTION SUPPRESSION

BACKGROUND OF THE INVENTION

1. Field of the Invention

The present invention is related to an audio amplifier, and more particularly, to a class-D amplifier that can reduce/cancel the pulse width modulation (PWM)-intermodulated distortion and meet the requirements of mass production and application corner condition and/or compact hardware design.

2. Description of the Prior Art

For a class-D amplifier with a closed-loop structure, the class-D amplifier may include a loop filter, a PWM generator, a power stage, and an optional inductor-capacitor (LC) filter, wherein an output terminal of the power stage is coupled to an input terminal of the loop filter to form a feedback path, and the in-band harmonic distortion at the output terminal of the power stage is suppressed by the high in-band gain of the loop filter. In addition to the in-band harmonic distortion, however, a high frequency component at the output terminal of the power stage may also be fed back to the loop filter. Under a condition that the out-of-band loop attenuation is insufficient, the high frequency component may intermodulate with the triangle wave signal of the PWM generator, which will cause the PWM intermodulation distortion at the output terminal of the power stage.

To address this problem, a conventional class-D amplifier may generate a compensation signal including a replicated version of the high frequency component through an additional replicated circuit (which at least includes a loop filter and a PWM generator being replicas of the above-mentioned loop filter and PWM generator), and add only the replicated version of the high frequency component to the input terminal of the loop filter by performing a high pass filtering operation upon the compensation signal, to reduce/cancel the high frequency component. The disadvantage of this conventional approach is that the hardware complexity is too high. For another conventional class-D amplifier, a shift delay operation may be performed upon a signal involved in the PWM generator by a delay buffer (e.g. the signal is delayed by 180 degrees to generate a delayed result), and a high pass filtered result of the delayed result may be added to the input terminal of the loop filter to reduce/cancel the high frequency component. However, since the delay buffer may suffer from PVT variation (e.g. process variation, voltage variation, and temperature variation), there may be difficulties in mass production application corner (more particularly, a high voltage or wide range application).

SUMMARY OF THE INVENTION

It is therefore one of the objectives of the present invention to provide an audio amplifier (e.g., a class-D amplifier) that can reduce/cancel audio distortion (e.g., PWM-intermodulated distortion) and meet the requirements of mass production and/or low hardware cost, to address the above-mentioned issues.

According to an embodiment of the present invention, a class-D amplifier is provided. The class-D amplifier may comprise a loop filter, at least one high pass filter (HPF) circuit, a PWM generator, and a power stage. The loop filter may comprise multiple amplifiers, and arranged to receive an audio signal and a feedback signal. The multiple amplifiers may comprise a first amplifier and a second amplifier, wherein the first amplifier has a first output node, and is arranged to process the audio signal and the feedback signal; the second amplifier has a first input node arranged to receive a first amplifier input and a second amplifier input; and the first amplifier input is obtained from a first signal path coupled between the first output node and the first input node. The at least one HPF circuit is coupled between the first amplifier and the second amplifier, and is arranged to receive an amplifier output of the first amplifier, and generate and output the second amplifier input according to the amplifier output of the first amplifier. The PWM generator is arranged to generate a PWM signal according to an amplifier output of the second amplifier. The power stage is arranged to drive a load according to the PWM signal. In addition, an output terminal of the power stage is coupled to an input terminal of the loop filter to form a feedback path, and the feedback signal is transmitted from the output terminal of the power stage to the input terminal of the loop filter through the feedback path.

One of the benefits of the present invention is that, by the configuration between the loop filter and the HPF circuit in the class-D amplifier of the present invention, the high frequency component included in the feedback signal can be reduced/canceled with low hardware complexity, and therefore the PWM intermodulation distortion can be reduced/canceled and the total harmonic distortion (THD) problem can be improved. In addition, since the class-D amplifier of the present invention will not suffer from the PVT variation (e.g. process variation, voltage variation, and temperature variation), mass production is easy to be achieved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
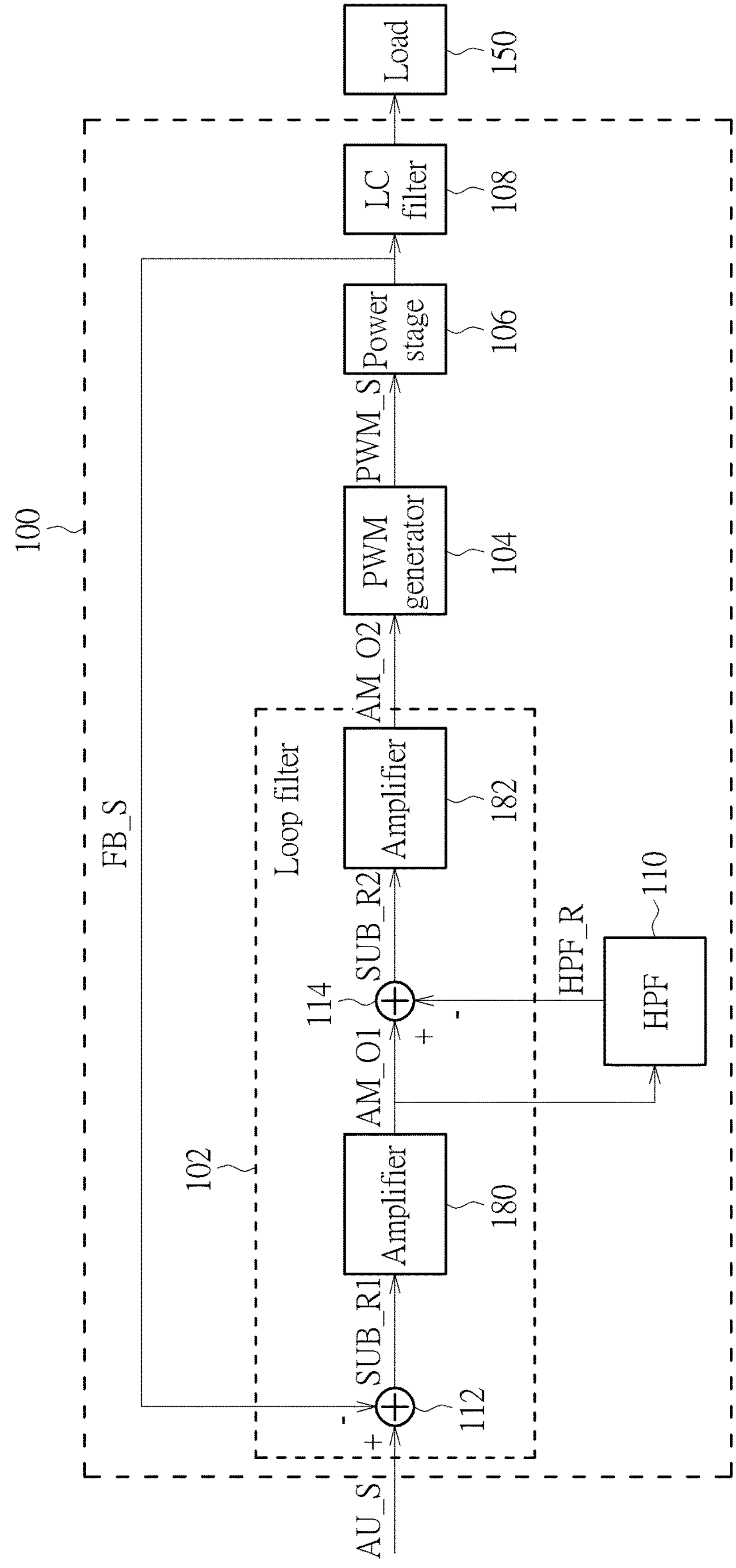
FIG. 1 is a block diagram of a class-D amplifier according to an embodiment of the present invention.

FIG. 1 is a diagram illustrating a class-D amplifier 100 according to an embodiment of the present invention. As shown in FIG. 1, the class-D amplifier 100 may include a loop filter 102, a pulse width modulation (PWM) generator 104, a power stage 106, an optional inductor-capacitor (LC) filter 108, at least one high pass filter (HPF) circuit 110, and multiple subtraction circuits 112 and 114, wherein an output terminal of the power stage 106 is coupled to an input terminal of the loop filter 102 to form a feedback path, and a feedback signal FB_S is transmitted from the output terminal of the power stage 106 to the input terminal of the loop filter 102 through the feedback path. The feedback signal FB_S may include an in-band harmonic distortion component and a high frequency component, wherein a frequency corresponding to the high frequency component may be higher than a PWM switching frequency of the PWM generator 104. That is, the high frequency component generated by the PWM generator 104 may be fed back to the input of the loop filter 102 through the feedback path and become a part of an input signal of the loop filter 102. The loop filter 102 may be arranged to process and suppress the in-band harmonic distortion component with high in-band gain. However, the high frequency component may cause the PWM intermodulation distortion at the output terminal of the power stage 106.

The loop filter 102 may include multiple amplifiers 180 and 182 and the subtraction circuits 112 and 114, and may be arranged to receive an audio signal AU_S and the feedback signal FB_S. The subtraction circuit 112 may be arranged to subtract the feedback signal FB_S from the audio signal AU_S to generate a subtraction result SUB_R1, and transmit the subtraction result SUB_R1 to the amplifier 180. The amplifier 180 may be arranged to process the audio signal AU_S and the feedback signal FB_S (i.e., the subtraction result SUB_R1), and generate an amplifier output AM_O1. In order to reduce/cancel the high frequency component included in the amplifier output AM_O1, the at least one HPF circuit 110 may be connected in parallel with a signal path coupled between an output terminal of the amplifier 180 and an input terminal of the amplifier 182, and may be arranged to perform a high pass filtering operation upon the amplifier output AM_O1 to generate and output a high pass filtered result HPF_R to the subtraction circuit 114 for high frequency component suppression.

The subtraction circuit 114 may be located at the signal path coupled between the output terminal of the amplifier 180 and the input terminal of the amplifier 182, and subtract the high pass filtered result HPF_R (which is the high frequency component included in the amplifier output AM_O1) from the amplifier output AM_O1 to generate a subtraction result SUB_R2. The amplifier 182 may be arranged to receive the subtraction result SUB_R2, and generate an amplifier output AM_O2 according to the subtraction result SUB_R2. The PWM generator 104 may be arranged to generate a PWM signal PNM S according to the amplifier output AM_O2. The power stage 106 may be arranged to drive a load 150 (e.g., a loudspeaker) according to the PWM signal PWM S. Since operations of the PWM generator 104 and the power stage 106 are well known to those skilled in the art, and the focus of the present invention is on the configuration between the at least one HPF circuit 110 and the amplifiers 180 and 182, further descriptions for the PWM generator 104 and the power stage 106 are omitted here.

In this embodiment, a number of amplifiers in the loop filter 102 is 2, but the present invention is not limited thereto. In practice, the number of amplifiers in the loop filter 102 may be an integer N greater than 2 (i.e., N>2), and the at least one HPF circuit 110 may be connected in parallel with a signal path coupled between any two of the amplifiers included in the loop filter 102, which may also be able to reduce/cancel an amplified high frequency component resulting from the high frequency component included in the feedback signal FB_S.

Figure 2:
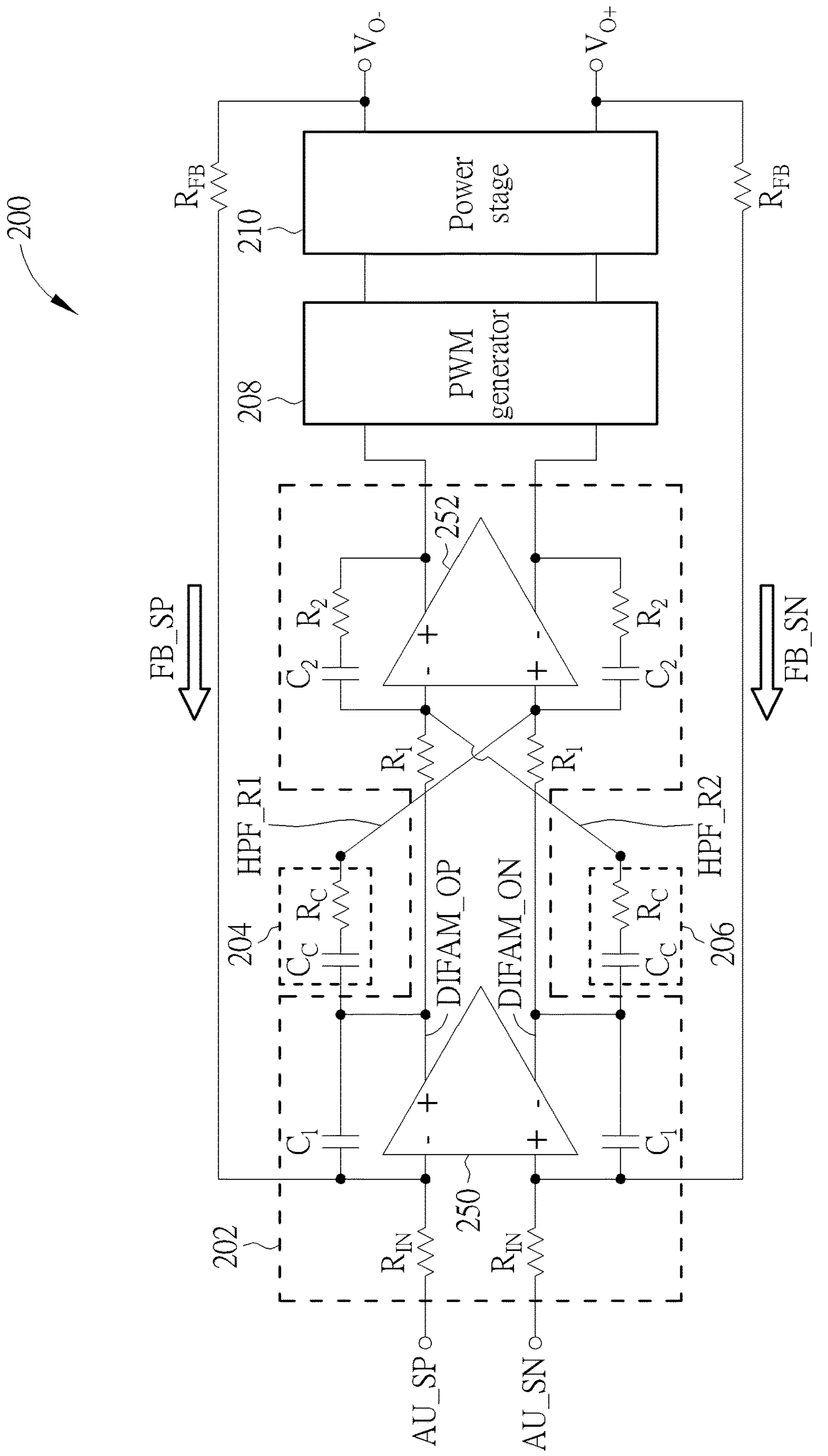
FIG. 2 is a diagram illustrating a class-D amplifier according to a first embodiment of the present invention.

In addition, each of the amplifiers 180 and 182 may be a differential amplifier (i.e., an amplifier configured to receive a differential input and generate a differential output) or a single-ended amplifier (i.e., an amplifier configured to receive a single-ended input and generate a single-ended output), depending upon actual design considerations. Under a condition that each of the amplifiers 180 and 182 is the differential amplifier, the operations of the subtraction circuit 114 may be implemented by differential nodes between the two differential amplifiers. Specifically, please refer to FIG. 2. FIG. 2 is a diagram illustrating a class-D amplifier 200 according to a first embodiment of the present invention, wherein the class-D amplifier 100 shown in FIG. 1 may be implemented by the class-D amplifier 200.

The class-D amplifier 200 may include a loop filter 202, multiple HPF circuits 204 and 206, a PWM generator 208, and a power stage 210, wherein the PWM generator 208 and the power stage 210 are the same as the PWM generator 104 and the power stage 106 of the class-D amplifier 100, respectively. In this embodiment, the class-D amplifier 200 may have a differential structure, and may be arranged to receive differential audio signals AU_SP and AU_SN, and generate differential output voltage signals $V_{o+}$ and $V_{o-}$ for driving a load (e.g., a loudspeaker). For example, the loop filter 202 may process the differential audio signals AU_SP and AU_SN, the PWM generator 208 may generate PWM signals according to an output of the loop filter 202, and the power stage 210 may generate the differential output voltage signals $V_{o+}$ and $V_{o-}$ according to the PWM signals.

The loop filter 202 may include multiple differential amplifiers 250 and 252, multiple internal resistors $R_{IN}$, $R_1$, and $R_2$, and multiple internal capacitors $C_1$ and $C_2$. The internal resistors $R_{IN}$ may be coupled to an inverting input terminal (denoted by "−" in FIG. 2) and a non-inverting input terminal (denoted by "+" in FIG. 2) of the differential amplifier 250, respectively, and differential audio signals AU_SP and AU_SN may be transmitted to the inverting input terminal and the non-inverting input terminal of the differential amplifier 250 through the internal resistors $R_{IN}$, respectively. One of the internal capacitors $C_1$ may be coupled between the inverting input terminal and a non-inverting output terminal (denoted by "+" in FIG. 2) of the differential amplifier 250, and the other of the internal capacitors $C_1$ may be coupled between the non-inverting input terminal and an inverting output terminal (denoted by "−" in FIG. 2) of the differential amplifier 250.

One combination of the internal capacitor $C_2$ and the internal resistor $R_2$ may be coupled between an inverting input terminal (denoted by "−" in FIG. 2) and a non-inverting output terminal (denoted by "+" in FIG. 2) of the differential amplifier 252, and the other combination of the internal capacitor $C_2$ and the internal resistor $R_2$ may be coupled between a non-inverting input terminal (denoted by "+" in FIG. 2) and an inverting output terminal (denoted by "−" in FIG. 2) of the differential amplifier 252. One of the internal resistors $R_1$ may be located at a first signal path coupled between the non-inverting output terminal of the differential amplifier 250 and the inverting input terminal of the differential amplifier 252, and the other of the internal resistors $R_1$ may be located at a second signal path coupled between the inverting output terminal of the differential amplifier 250 and the non-inverting input terminal of the differential amplifier 252.

In this embodiment, differential feedback signals FB_SP and FB_SN are transmitted from the output terminal of the power stage 210 to the inverting input terminal and the non-inverting input terminal of the differential amplifier 250 through feedback resistors $R_{FB}$, respectively. In order to reduce/cancel the amplified high frequency components resulting from high frequency components in the differential feedback signals FB_SP and FB_SN, the HPF circuit 204 may be located at a first compensation path coupled between the non-inverting output terminal of the differential amplifier 250 and the non-inverting input terminal of the differential amplifier 252, and the HPF circuit 206 may be located at a second compensation path coupled between the inverting output terminal of the differential amplifier 250 and the inverting input terminal of the differential amplifier 252, wherein the first compensation path is different from the above-mentioned first signal path (i.e., the first compensation path does not overlap the first signal path), and the second compensation path is different from the above-mentioned second signal path (i.e., the second compensation path does not overlap the second signal path).

The HPF circuit 204 may be arranged to receive a differential amplifier output DIFAM_OP of the differential amplifier 250 from the non-inverting output terminal of the differential amplifier 250, perform a high pass filtering operation upon the differential amplifier output DIFAM_OP to generate a high pass filtered result HPF_R1, and transmit the high pass filtered result HPF_R1 to the non-inverting input terminal of the differential amplifier 252. As a result, at the non-inverting input terminal of the differential amplifier 252, an original amplifier input from the inverting output terminal of the different amplifier 250 (e.g., a differential amplifier output DIFAM_ON) and the high pass filtered result HPF_R1 acting as another amplifier input from the non-inverting output terminal of the differential amplifier 250 may be received. Since the original amplifier input and the high pass filtered result HPF_R1 are from different differential output terminals of the differential amplifier 250, the amplified high frequency components resulting from the high frequency components of the feedback signals FB_SP and FB_SN can be reduced/canceled by summing up the original amplifier input and the high pass filtered result HPF_R1 at the non-inverting input terminal of the differential amplifier 252.

Similarly, the HPF circuit 206 may be arranged to receive the differential amplifier output DIFAM_ON of the differential amplifier 250 from the inverting output terminal of the differential amplifier 250, perform a high pass filtering operation upon the differential amplifier output DIFAM_ON to generate a high pass filtered result HPF_R2, and transmit the high pass filtered result HPF_R2 to the inverting input terminal of the differential amplifier 252. As a result, at the inverting input terminal of the differential amplifier 252, an original amplifier input from the non-inverting output terminal of the different amplifier 250 (e.g., the differential amplifier output DIFAM_OP) and the high pass filtered result HPF_R2 acting as another amplifier input from the inverting output terminal of the differential amplifier 250 may be received. Since the original amplifier input and the high pass filtered result HPF_R2 are from different differential output terminals of the differential amplifier 250, the amplified high frequency components resulting from the high frequency components of the feedback signals FB_SP and FB_SN can be reduced/canceled by summing up the original amplifier input and the high pass filtered result HPF_R2 at the inverting input terminal of the differential amplifier 252.

In addition, each of the HPF circuits 204 and 206 may include a compensation capacitor $C_c$ and a compensation resistor $R_c$, wherein a resistance value of the compensation resistor $R_c$ is equal to that of the internal resistors $R_1$, and a capacitance value of the compensation capacitor $C_c$ can be adjusted according to the degree of high pass filtering.

Figure 3:
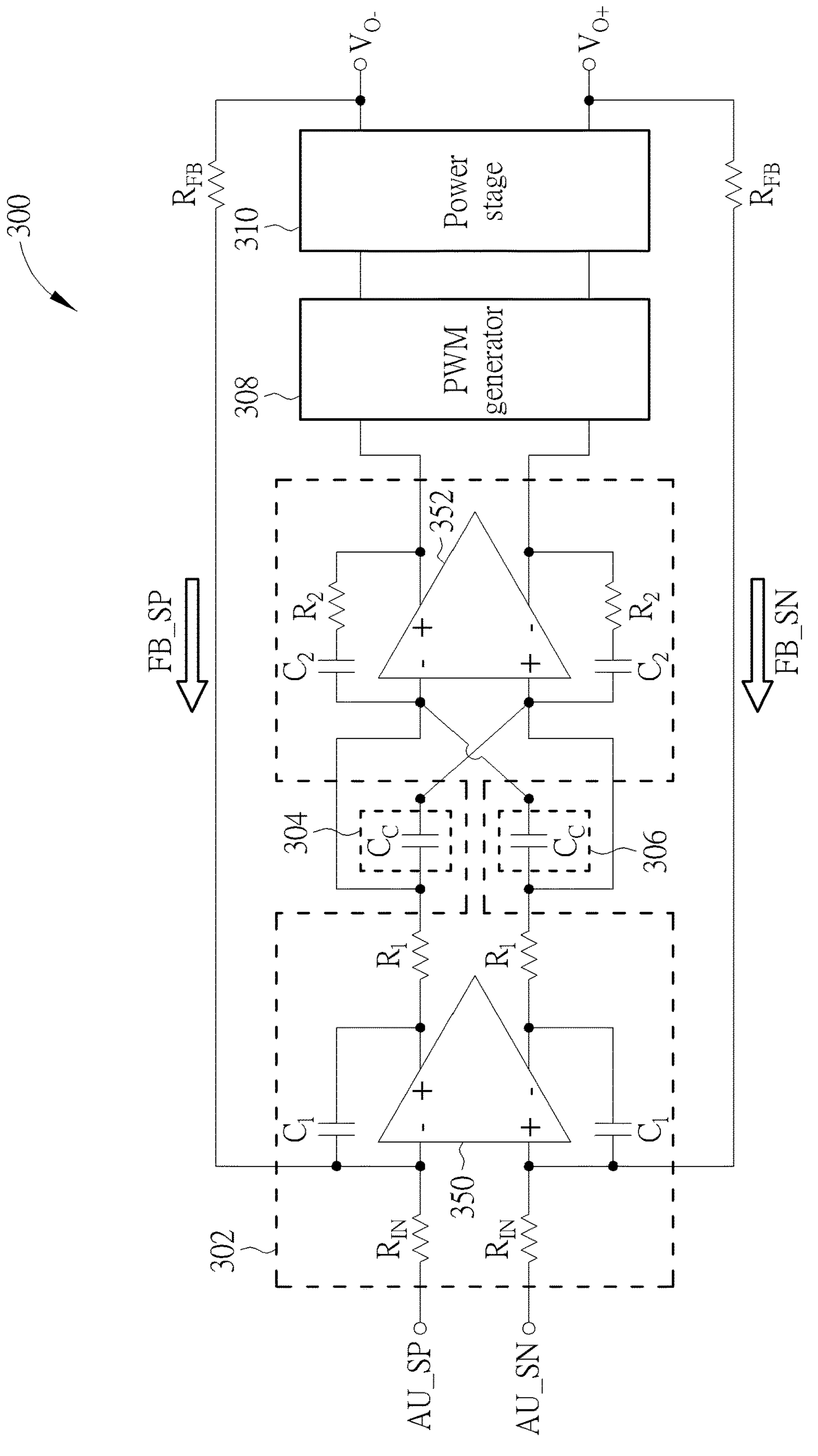
FIG. 3 is a diagram illustrating a class-D amplifier according to a second embodiment of the present invention.

FIG. 3 is a diagram illustrating a class-D amplifier 300 according to a second embodiment of the present invention, wherein the class-D amplifier 100 shown in FIG. 1 may be implemented by the class-D amplifier 300. As shown in FIG. 3, the class-D amplifier 300 may include a loop filter 302, multiple HPF circuits 304 and 306, a PWM generator 308, and a power stage 310, wherein the loop filter 302 may include differential amplifiers 350 and 352. The difference between the class-D amplifier 200 shown in FIG. 2 and the class-D amplifier 300 is that each of the HPF circuits 304 and 306 is modified to only include the compensation capacitor $C_c$. In addition, one of the internal resistors $R_1$ (hereafter denoted by "$R_{1U}$") may be located at a first signal path coupled between a non-inverting output terminal of the differential amplifier 350 and an inverting input terminal of the differential amplifier 352 (i.e., the internal resistor $R_{1U}$ may have a first terminal coupled to the non-inverting output terminal of the differential amplifier 350 and a second terminal coupled to the inverting input terminal of the differential amplifier 352). The HPF circuit 304 may be located at a first compensation path coupled between the second terminal of the internal resistor $R_{1U}$ and a non-inverting input terminal of the differential amplifier 352 (i.e., the HPF circuit 304 may have a first terminal coupled to the second terminal of the internal resistor $R_{1U}$ and a second terminal coupled to the non-inverting input terminal of the differential amplifier 352), wherein the first compensation path is different from the first signal path, and does not overlap the first signal path.

Similarly, the other of the internal resistors $R_1$ (hereafter denoted by "$R_{1D}$") may be located at a second signal path coupled between an inverting output terminal of the differential amplifier 350 and a non-inverting input terminal of the differential amplifier 352 (i.e., the internal resistor $R_{1D}$ may have a first terminal coupled to the inverting output terminal of the differential amplifier 350 and a second terminal coupled to the non-inverting input terminal of the differential amplifier 352). The HPF circuit 306 may be located at a second compensation path coupled between the second terminal of the internal resistor $R_{1D}$ and an inverting input terminal of the differential amplifier 352 (i.e., the HPF circuit 306 may have a first terminal coupled to the second terminal of the internal resistor $R_{1D}$ and a second terminal coupled to the inverting input terminal of the differential amplifier 352), wherein the second compensation path is different from the second signal path, and does not overlap the second signal path.

In this embodiment, at the inverting input terminal of the differential amplifier 352, an original amplifier input from the first signal path (more particularly, the non-inverting output terminal of the different amplifier 350) and a high pass filtered result acting as another amplifier input from the second compensation path (more particularly, the inverting output terminal of the differential amplifier 350) may be received. Since the original amplifier input and the high pass filtered result are from different differential output terminals of the differential amplifier 350, the high frequency components of the feedback signals FB_SP and FB_SN can be reduced/canceled by summing up the original amplifier input and the high pass filtered result at the inverting input terminal of the differential amplifier 352.

Similarly, at the non-inverting input terminal of the differential amplifier 352, an original amplifier input from the second signal path (more particularly, the inverting output terminal of the different amplifier 350) and a high pass filtered result acting as another amplifier input from the first compensation path (more particularly, the non-inverting output terminal of the differential amplifier 350) may be received. Since the original amplifier input and the high pass filtered result are from different differential output terminals of the differential amplifier 350, the high frequency components of the feedback signals FB_SP and FB_SN can be reduced/canceled by summing up the original amplifier input and the high pass filtered result at the non-inverting input terminal of the differential amplifier 352. Due to the fact that the operations of the class-D amplifier 300 are similar to that of the class-D amplifier 200 shown in FIG. 2, further descriptions are omitted here for brevity.

Figure 4:
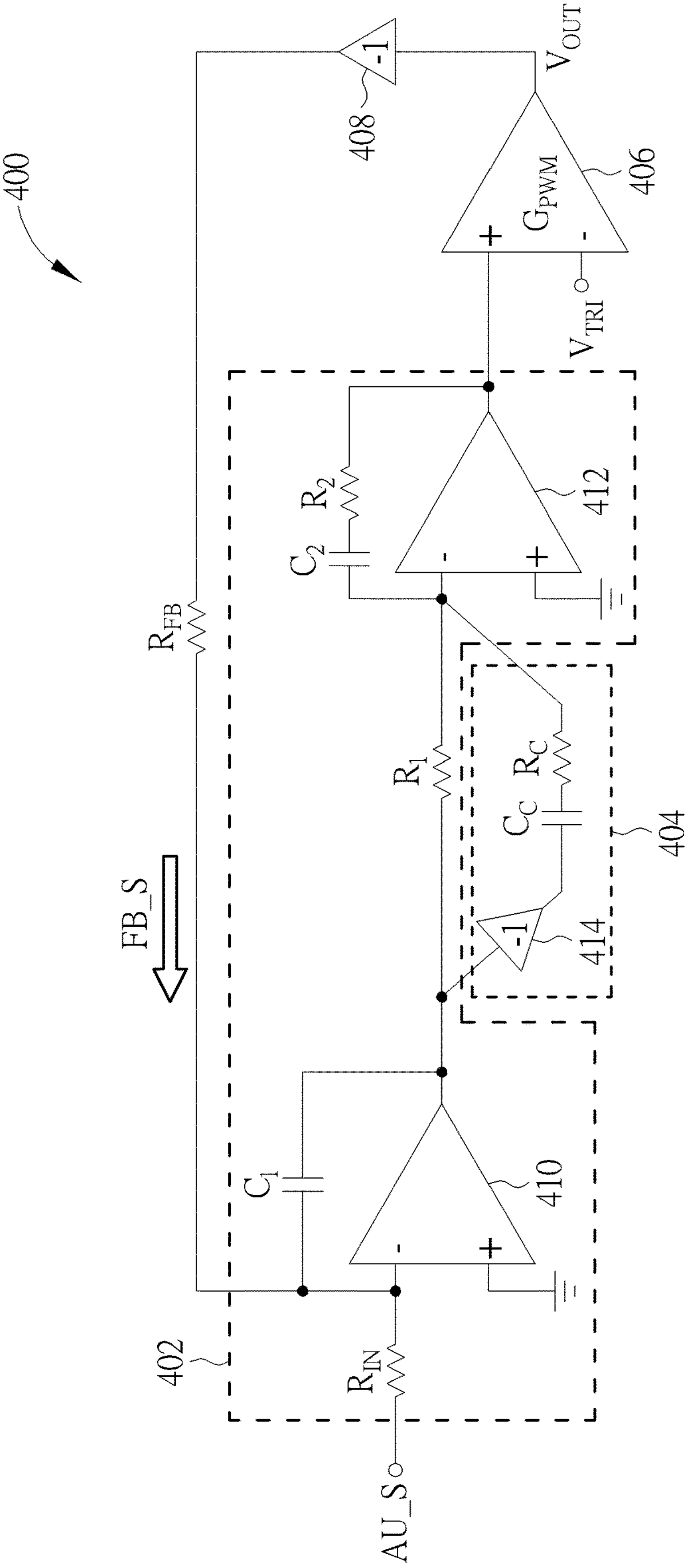
FIG. 4 is a diagram illustrating a class-D amplifier according to a third embodiment of the present invention.

For the class-D amplifier 100 shown in FIG. 1, each of the amplifiers 180 and 182 can also be a single-ended amplifier, and the operations of the subtraction circuit 114 can be implemented by an inverse buffer included in the at least one HPF circuit 110. Specifically, please refer to FIG. 4. FIG. 4 is a diagram illustrating a class-D amplifier 400 according to a third embodiment of the present invention, wherein a part of the class-D amplifier 100 shown in FIG. 1 may be implemented by the class-D amplifier 400. As shown in FIG. 4, the class-D amplifier 400 may include a loop filter 402, an HPF circuit 404, an output stage amplifier 406 (labeled as "$G_P$WM" in FIG. 4), and an inverse buffer 408, wherein the output stage amplifier 406 may correspond to the PWM generator 104 shown in FIG. 1, and may be arranged to generate an output voltage signal $V_{OUT}$ according to an output of the loop filter 402, for driving a power stage (e.g., power stage 106 shown in FIG. 1). For example, the output stage amplifier 406 has a non-inverting input terminal (denoted by "+" in FIG. 4), an inverting input terminal (denoted by "−" in FIG. 4), and an output terminal, wherein the non-inverting input terminal may receive the output of the loop filter 402, the inverting input terminal may receive a voltage signal $V_{TRI}$ corresponding to a triangle wave, and the output voltage signal $V_{OUT}$ may be output from the output terminal to act as a PWM signal.

The loop filter 402 may include multiple amplifiers 410 and 412 with a single-ended input structure (e.g., one input terminal receiving a single-ended voltage input and the other input terminal coupled to ground) and a single-ended output structure (e.g., one output terminal outputting a single-ended voltage output), multiple internal resistors $R_{IN}$, $R_1$, and $R_2$, and multiple internal capacitors $C_1$ and $C_2$. The internal resistor $R_{IN}$ may be coupled to an inverting input terminal (denoted by "−" in FIG. 4) of the amplifier 410, and a non-inverting input terminal (denoted by "+" in FIG. 4) of the amplifier 410 may be coupled to a reference voltage (e.g., a ground voltage), wherein an audio signal AU_S may be transmitted to the inverting input terminal of the amplifier 410 through the internal resistor $R_{IN}$. The internal capacitor $C_1$ may be coupled between the inverting input terminal and an output terminal of the amplifier 410. The combination of the internal capacitor $C_2$ and the internal resistor $R_2$ may be coupled between an inverting input terminal (denoted by "−" in FIG. 4) and an output terminal of the amplifier 412, and a non-inverting input terminal (denoted by "+" in FIG. 4) of the amplifier 412 may be coupled to a reference voltage (e.g., the ground voltage). The internal resistor $R_1$ may be located at a signal path coupled between the output terminal of the amplifier 410 and the inverting input terminal of the amplifier 412.

In this embodiment, a feedback signal FB_S is transmitted from the output terminal of the output stage amplifier 406 to the inverting input terminal of the amplifier 410 through a feedback resistor $R_{FB}$. For example, an inverse operation may be performed upon the output voltage signal $V_{OUT}$ by the inverse buffer 408, to generate the feedback signal FB_S. In order to reduce/cancel the amplified high frequency component resulting from the high frequency component in the feedback signal FB_S, the HPF circuit 404 may be located at a compensation path coupled between the output terminal of the amplifier 410 and the inverting input terminal of the amplifier 412, wherein the compensation path is different from the above-mentioned signal path coupled between the output terminal of the amplifier 410 and the inverting input terminal of the amplifier 412 (i.e., the compensation path does not overlap the signal path).

The HPF circuit 404 may be arranged to receive an amplifier output of the amplifier 410 from the output terminal of the amplifier 410, perform an inverse operation upon the amplifier output to generate an inversed result, perform a high pass filtering operation upon the inversed result to generate a high pass filtered result, and transmit the high pass filtered result to the inverting input terminal of the amplifier 412. Specifically, the HPF circuit 404 may include an inverse buffer 414, a compensation capacitor $C_c$, and a compensation resistor $R_c$, wherein the inverse operation is performed by the inverse buffer 414, and a resistance value of the compensation resistor $R_c$ is equal to that of the internal resistor $R_1$. As a result, at the inverting input terminal of the amplifier 412, an original amplifier input from the above-mentioned signal path and the high pass filtered result acting as another amplifier input from the compensation path may be received. Since the high pass filtered result is an inverse of the original amplifier input, the high frequency components that have opposite polarities and derived from the same feedback signal FB_S can be reduced/canceled by summing up the original amplifier input and the high pass filtered result at the inverting input terminal of the amplifier 412.

In summary, by the configuration between the loop filter and the HPF circuit in the class-D amplifier of the present invention, the high frequency component included in the feedback signal can be reduced/canceled with low hardware complexity, and therefore the PWM intermodulation distortion can be reduced/canceled and the total harmonic distortion (THD) problem can be improved. In addition, since the class-D amplifier of the present invention will not suffer from the PVT variation (e.g. process variation, voltage variation, and temperature variation), mass production application corners are easy to be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio amplifier, comprising:

a loop filter, comprising multiple amplifiers, and arranged to receive an audio signal and a feedback signal, wherein the multiple amplifiers comprise:

a first amplifier, having a first output node, and arranged to process the audio signal and the feedback signal; and a second amplifier, having a first input node arranged to receive a first amplifier input and a second amplifier input, wherein the first amplifier input is obtained from a first signal path coupled between the first output node and the first input node;

at least one high pass filter (HPF) circuit, coupled between the first amplifier and the second amplifier, and arranged to receive an amplifier output of the first amplifier, and generate and output the second amplifier input according to the amplifier output of the first amplifier;

a pulse width modulation (PWM) generator, arranged to generate a PWM signal according to an amplifier output of the second amplifier; and a power stage, arranged to drive a load according to the PWM signal;

wherein an output terminal of the power stage is coupled to an input terminal of the loop filter to form a feedback path, and the feedback signal is transmitted from the output terminal of the power stage to the input terminal of the loop filter through the feedback path;

wherein the second amplifier input is a high-pass filtered result of an inversion version of the first amplifier input, and the first amplifier input and the second amplifier input is added at the first input node of the second amplifier for reducing a high frequency component of the first amplifier input.

2. The audio amplifier of claim 1, wherein each of the first amplifier and the second amplifier is a differential amplifier, the first amplifier further comprises a second output node, the first output node and the second output node are a non-inverting output terminal and an inverting output terminal of the first amplifier, respectively; the second amplifier further comprises a second input node, and the first input node and the second input node are an inverting input terminal and a non-inverting input terminal of the second amplifier, respectively.

3. The audio amplifier of claim 2, wherein the at least one HPF circuit comprises a first HPF circuit and a second HPF circuit; the first HPF circuit is located at a first compensation path coupled between the non-inverting output terminal of the first amplifier and the non-inverting input terminal of the second amplifier; and the second HPF circuit is located at a second compensation path coupled between the inverting output terminal of the first amplifier and the inverting input terminal of the second amplifier.

4. The audio amplifier of claim 3, wherein the first HPF circuit comprises a first capacitor and a first resistor, and the second HPF circuit comprises a second capacitor and a second resistor.

5. The audio amplifier of claim 4, wherein a second signal path is coupled between the inverting output terminal of the first amplifier and the non-inverting input terminal of the second amplifier, the loop filter further comprises a first internal resistor located at the first signal path and a second internal resistor located at the second signal path, and a resistance value of the first resistor, a resistance value of the first internal resistor, a resistance value of the second resistor, and a resistance of the second internal resistor are identical.

6. The audio amplifier of claim 2, wherein the at least one HPF circuit comprises a first HPF circuit and a second HPF circuit, and a second signal path is coupled between the inverting output terminal of the first amplifier and the non-inverting input terminal of the second amplifier; the loop filter further comprises a first internal resistor located at the first signal path and a second internal resistor located at the second signal path; the first HPF circuit is located at a first compensation path coupled between the first internal resistor and the non-inverting input terminal of the second amplifier, the second HPF circuit is located at a second compensation path coupled between the second internal resistor and the inverting input terminal of the second amplifier.

7. The audio amplifier of claim 6, wherein the first HPF circuit comprises a first capacitor, and the second HPF circuit comprises a second capacitor.

8. The audio amplifier of claim 1, wherein each of the first amplifier and the second amplifier is an amplifier with a single-ended output structure.

9. The audio amplifier of claim 8, wherein the at least one HPF circuit is located at a compensation path coupled between the first output node of the first amplifier and the first input node of the second amplifier, and the compensation path is different from the first signal path.

10. The audio amplifier of claim 9, wherein the at least one HPF circuit comprises a first HPF circuit, and the first HPF circuit comprises a first inverse buffer, a first capacitor, and a first resistor.

11. The audio amplifier of claim 10, wherein the loop filter further comprises an internal resistor, the internal resistor is located at the first signal path, and a resistance value of the first resistor is equal to a resistance value of the internal resistor.

12. The audio amplifier of claim 1, wherein the audio amplifier is a class-D amplifier.

* * * * *